(12) United States Patent
Prakash et al.

(10) Patent No.: US 12,387,795 B2
(45) Date of Patent: Aug. 12, 2025

(54) LOW STRESS REFRESH ERASE IN A MEMORY DEVICE

(71) Applicant: Micron Technology, Inc., Boise, ID (US)

(72) Inventors: Ronit Roneel Prakash, Kanagawa Prefecture (JP); Pitamber Shukla, Boise, ID (US); Ching-Huang Lu, Fremont, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 183 days.

(21) Appl. No.: 18/234,289

(22) Filed: Aug. 15, 2023

(65) Prior Publication Data

US 2024/0062827 A1 Feb. 22, 2024

Related U.S. Application Data

(60) Provisional application No. 63/399,950, filed on Aug. 22, 2022.

(51) Int. Cl.
*G11C 16/34* (2006.01)
*G11C 16/10* (2006.01)
*G11C 16/16* (2006.01)
*G11C 16/26* (2006.01)

(52) U.S. Cl.
CPC .......... *G11C 16/16* (2013.01); *G11C 16/102* (2013.01); *G11C 16/26* (2013.01); *G11C 16/3445* (2013.01)

(58) Field of Classification Search
CPC ................. G11C 16/34; G11C 11/56
See application file for complete search history.

(56) References Cited

U.S. PATENT DOCUMENTS

2016/0099047 A1\* 4/2016 Lee ............... G11C 11/5642
365/185.03

\* cited by examiner

*Primary Examiner* — Jason Lappas
(74) *Attorney, Agent, or Firm* — Lowenstein Sandler LLP

(57) ABSTRACT

A memory device can include a memory device coupled with a processing device. The processing device causes a first erase operation to be performed at a block, where the first erase operation causes a pre-program voltage and a first erase voltage having a first magnitude to be applied to the block. The processing device causes an erase detection operation to be performed at the block. The processing device determines that the block fails to satisfy the erase detection operation responsive to causing the erase detection operation to be performed. The processing device further causes a second erase operation to be performed at the block responsive to determining that the block failed the erase detection operation, where the second erase operation causes a second erase voltage having a second magnitude to be applied to the block.

20 Claims, 6 Drawing Sheets

LOW STRESS REFRESH ERASE IN A MEMORY DEVICE

RELATED APPLICATIONS

This application claims the benefit of U.S. Provisional Patent Application No. 63/399,950, filed Aug. 22, 2022, the entire contents of which are hereby incorporated by reference herein.

TECHNICAL FIELD

Embodiments of the disclosure relate generally to memory sub-systems, and more specifically, relate to a low stress refresh erase in a memory device of a memory sub-system to enhance performance and reliability.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1A:
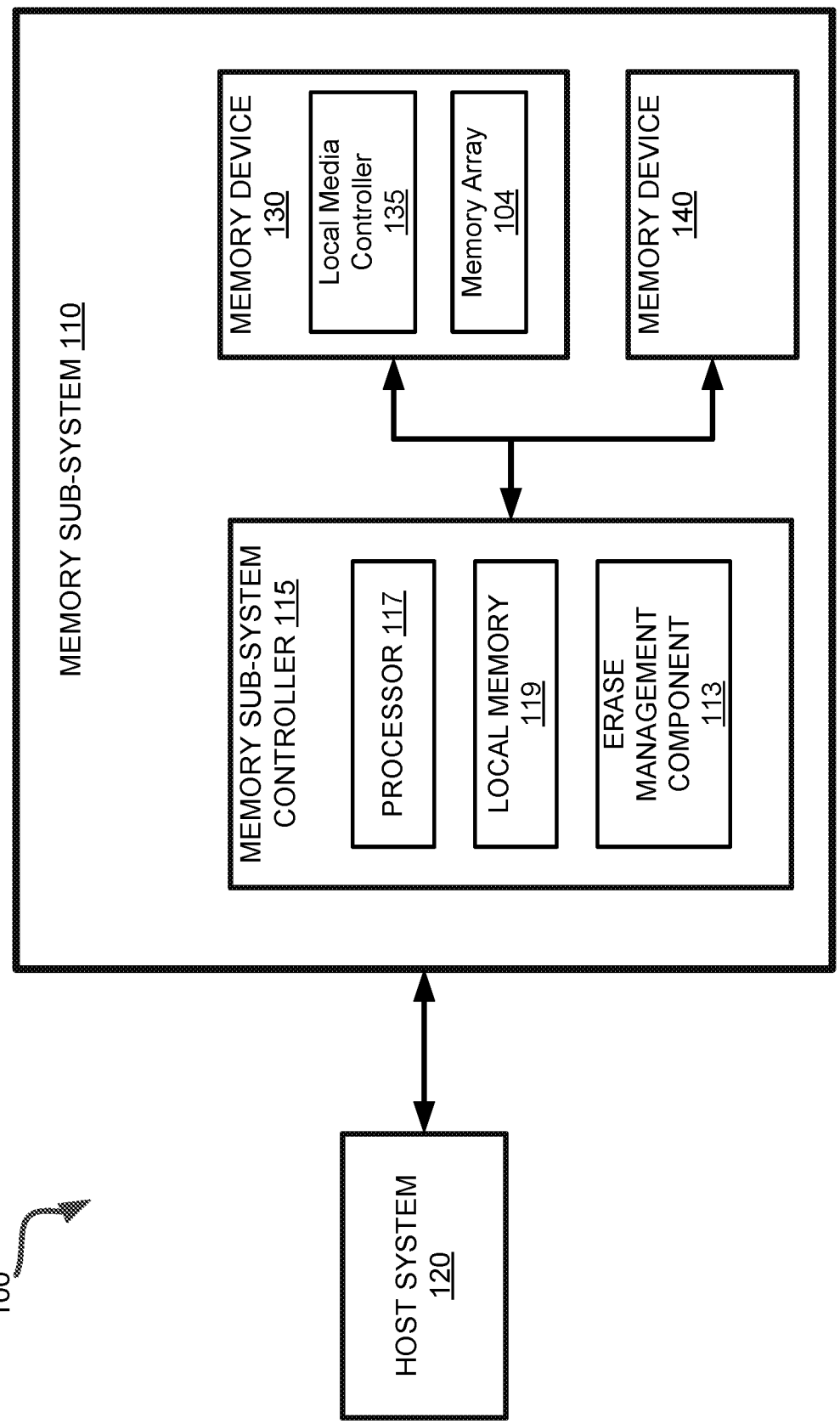
FIG. 1A illustrates an example computing system that includes a memory sub-system in accordance with some embodiments of the present disclosure.

Aspects of the present disclosure are directed to a low stress refresh erase in a memory device. For example, aspects of the present disclosure are directed to performing the low stress refresh erase after an initial erase operation is complete and a block is waiting to be programmed. A memory sub-system can be a storage device, a memory module, or a combination of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bit lines) and rows (also hereinafter referred to as wordlines). A wordline can refer to one or more rows of memory cells of a memory device that are used with one or more bit lines to generate the address of each of the memory cells. The intersection of a bit line and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane. Each data block can include a number of sub-blocks, where each sub-block is defined by an associated pillar (e.g., a vertical conductive trace) extending from a shared bit line. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of channel material. The memory cells can be coupled to access lines, which are commonly referred to as "wordlines," often fabricated in common with the memory cells, so as to form an array of strings in a block of memory. The compact nature of certain non-volatile memory devices, such as 3D flash NAND memory, means wordlines are common to many memory cells within a block of memory.

During a program operation or an erase operation on a non-volatile memory device, a selected memory cell(s) can be programmed or erased with the application of a voltage to a selected wordline. Due to the wordline being common to multiple memory cells, unselected memory cells can be subject to the same programming voltage as the selected memory cell(s). If not otherwise preconditioned, the unselected memory cells can experience effects from the programming voltage on the common wordline. The programming voltage effects can include the condition of charge being stored in the unselected memory cells which are expected to maintain stored data. This programming voltage effect is termed a "programming disturbance" or "program disturb" effect. Although memory cells undergoing program disturb are still apparently readable, the contents of the memory cell can be read as a data value different than the intended data value stored before application of the programming voltage.

Some blocks can be designated to be erased before being programmed or reprogrammed—e.g., a block storing data can be erased and then programmed with new data. During the erase operation, relatively high voltages can be applied to the wordline during a pre-program phase of the erase operation and relatively high voltages can be applied to the channel while applying an erase voltage. For example, a conventional erase operation can include applying an initial pre-programming pulse to wordlines of the block to reset memory cells with a lower threshold voltage. The erase operation can then include applying an erase voltage (e.g., Vera) to erase the memory cells of the block. After applying the erase voltage, an erase verify (e.g., evfy) voltage can be applied to determine whether each wordline (e.g., each memory cell) is erased—e.g., to determine if each wordline or memory cell is below an erase threshold voltage. During the erase operation, electrons can be removed and holes can be injected into the selected wordline—e.g., holes can form in the channel or charge trap layer, allowing electrons to flow into the channel. For example, injected holes can be trapped in storage nitride of array transistors connected to the wordlines that have been erased. Since the channel region (i.e., the pillar) in some non-volatile memory devices is a floating channel that may not be connected to a bulk grounded body, it can take a certain amount of time before the residue holes are discharged. These residue holes can contribute to program disturb in a number of ways. For example, some conventional methods for programming a block include performing an erase operation and then a programming operation immediately after the erase operation. However, performing the programming operation immediately following the erase operation can cause residual holes to remain trapped during the programming process. Accordingly, the residual holes may not discharge until after the programming operation, particularly for quad-level cells (QLC memory cells) that are programmed first—e.g., the QLC memory cells programmed to lower threshold voltages or logic states can experience the most programming disturbances. When the residual holes discharge during or after the programming operation, a threshold voltage of memory cells can shift—e.g., the voltage threshold of the memory cells can increase after the residue holes are discharged. This can impact read margins and may cause the contents of the memory cell to be read as a data value different than the intended data value stored during the application of the programming voltage.

To reduce a number of residual holes trapped in the wordline or channel, some conventional methods include waiting a certain period after the erase operation before initiating the programming operation—e.g., the memory sub-system controller can wait an hour after erasing a block before programming the respective block with data. However, as the residual holes are discharged, memory cells can experience a voltage threshold shift—e.g., the memory cell threshold voltage can increase due to the discharged residual holes. In some cases, the shifted threshold voltage can fail to satisfy an erase threshold voltage—e.g., the memory cell threshold voltage can shift or drift beyond the erase threshold voltage during the waiting period. Accordingly, the memory sub-system controller can monitor empty pages (e.g., erased blocks) by performing erase detection operations periodically until a program operation is initiated for the respective block—e.g., perform a detect an empty page operation periodically. During the erase detection operation, the memory sub-system controller can cause a read voltage to be applied on certain wordlines (e.g., randomly or conforming to a predetermined pattern) to determine if a voltage threshold of a respective memory cell exceeds the erase threshold—e.g., the read voltage can be the erase threshold to determine if any memory cells exceed the erase threshold. Accordingly, the memory sub-system controller can determine a number of memory cells or wordlines failing to satisfy the read threshold (e.g., exceeding the read threshold). The memory sub-system controller can compare the number of memory cells or wordlines failing to satisfy the read threshold (e.g., "the number") with a threshold number of memory cells or wordlines failing to satisfy the read threshold. If the memory sub-system controller determines the number satisfies (e.g., is less than) the threshold number, the memory sub-system controller can wait and continue to perform periodic erase detection operations until the programming command is received—e.g., perform an erase detection operation each time a duration elapses. If the memory sub-system controller determines the number does not satisfy (e.g., fails to satisfy or is equal to or greater than) the threshold number, conventional methods include performing an additional conventional erase operation—e.g., applying at least the pre-programming pulse, an erase voltage, and then erase verify voltage. However, as described above, the conventional erase can cause residual holes to become trapped. Accordingly, if the block is programmed shortly after the second conventional erase, the residual holes can cause programming disturbances and eliminate any benefits from waiting after the initial conventional erase operation.

Aspects of the present disclosure address the above and other deficiencies by implementing a low stress refresh erase designed to reduce program disturb in a memory device of a memory sub-system. In one embodiment, the memory sub-system controller can designate a block for erasure. Then, the memory sub-system controller can cause a first erase operation to be performed on the block. In at least one embodiment, the first erase operation includes application of at least a pre-programming voltage, a first erase voltage, and an erase verify voltage. Following the first erase operation, the memory sub-system controller can periodically perform erase detection operations until a program operation is initiated at the block. If the block fails to satisfy any erase detection operation, the memory sub-system controller can cause a second erase operation to be performed. In some embodiments, the second erase operation includes application of a second erase voltage and the erase verify voltage. In some embodiments, the memory sub-system controller can refrain from applying the pre-programming voltage during the second erase operation. For example, the pre-programming voltage (e.g., pulse) can reset memory cells to be at or above a predetermined voltage—e.g., the pre-programming voltage can reduce a voltage gap (i.e., difference) between a lowest threshold voltage state and a highest threshold voltage state of the memory cells. But when the first erase operation is performed, even after the residual holes are discharged, the voltage gap between the lowest threshold voltage state and the highest threshold voltage can be relatively small compared with the voltage gap before the first erase operation. Accordingly, the second erase operation can effectively erase the memory cells without applying the pre-programming pulse. In some embodiments, the second erase operation includes application of relatively small pre-program voltage—e.g., applying a relatively small pre-program voltage can give a same effect as applying no pre-program voltage. Additionally, because the voltage gap is relatively small and most memory cells are close to the erase threshold even after the threshold voltage shift caused by discharging the residual holes, the second erase operation can apply a smaller erase voltage—e.g., a magnitude of the second erase voltage is smaller than a magnitude of the first erase voltage. In some cases, the second erase voltage is also applied for a shorter duration than the first erase voltage. Because the second erase operation refrains from applying the pre-program pulse and uses a smaller erase voltage, the second erase operation can reduce the number of holes electrons trapped in the channel.

By utilizing the second erase operation (e.g., the low stress refresh erase), programming disturbances are reduced and the overall performance of the system is improved. Additionally, the second erase operation can improve data retention and increase a life cycle of respective memory cells.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory device 130 includes an erase management component 113 that can oversee, control, and/or manage erase performed on a non-volatile memory device, such as memory device 130, of memory sub-system 110. Erase management component 113 is responsible for causing certain voltages to be applied (or indicating which voltages to apply) to memory device 130 during the erase operation. In at least one embodiment, the erase management component 113 is configured to perform a first erase operation on a block, where the first erase operation includes at least a pre-program voltage, a first erase voltage, and an erase verify voltage. In some embodiments, the erase management component 113 can periodically perform an erase detection operation on the block while waiting for a program command after performing the first erase operation. In at least one embodiment, the erase management component 113 can perform a second erase operation if the block fails to satisfy the erase detection operation—e.g., one or more memory cells or wordlines have a voltage threshold greater than or equal to an erase threshold. In such embodiments, the second erase operation includes a second erase voltage and the erase verify voltage—e.g., the erase management component 113 can refrain from causing the pre-program voltage to be applied in the second erase operation. In some embodiments, the erase management component 113 can cause a relatively small (e.g., low voltage) pre-program voltage to be applied during the second erase operation. In at least one embodiment, the magnitude of the second erase voltage is less than a magnitude of the first erase voltage. In some embodiments, a duration the second erase voltage is applied is less than a duration the first erase voltage is applied. In some embodiments, the erase management component 113 can continue to perform the second erase operation each time the block fails the erase detection operation until a program operation is initiated at the block.

In some embodiments, the memory sub-system controller 115 includes at least a portion of erase management component 113. For example, the memory sub-system controller 115 can include a processor 117 (e.g., a processing device) configured to execute instructions stored in local memory 119 for performing the operations described herein. In some embodiments, erase management component 113 is part of the host system 110, an application, or an operating system. In other embodiment, local media controller 135 includes at least a portion of erase management component 113 and is configured to perform the functionality described herein. In such an embodiment, erase management component 113 can be implemented using hardware or as firmware, stored on memory device 130, executed by the control logic (e.g., erase management component 113) to perform the operations related to program recovery described herein.

Figure 1B:
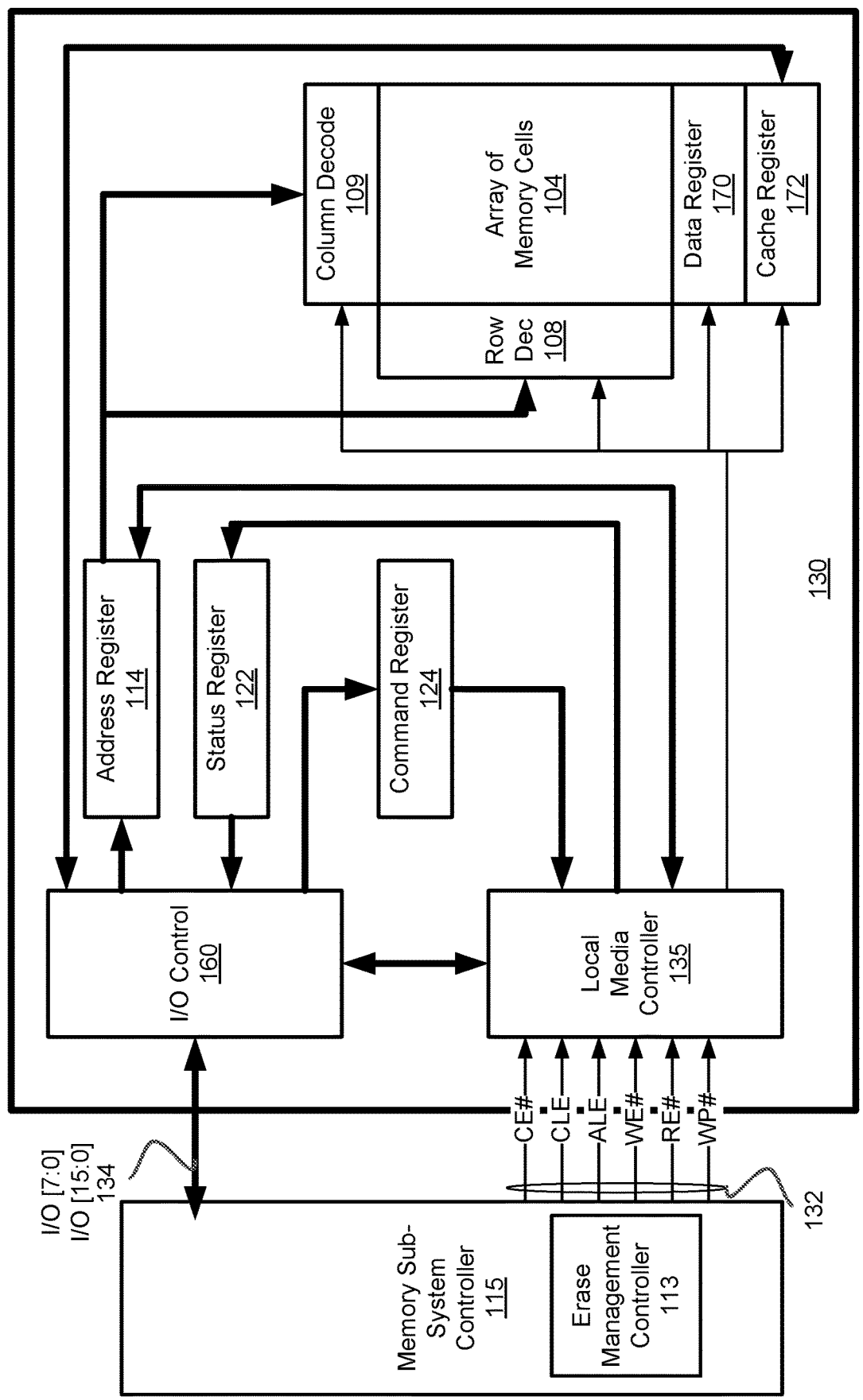
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device. The memory sub-system controller 115 can include the erase management component 113.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states. In one embodiment, the array of memory cells 104 (i.e., a "memory array") can include a number of sacrificial memory cells used to detect the occurrence of read disturb in memory device 130, as described in detail herein.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 236 and outputs data to the memory sub-system controller 115 over I/O bus 236.

For example, the commands may be received over input/output (I/O) pins [7:0] of I/O bus 236 at I/O control circuitry 160 and may then be written into command register 124. The addresses may be received over input/output (I/O) pins [7:0] of I/O bus 236 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
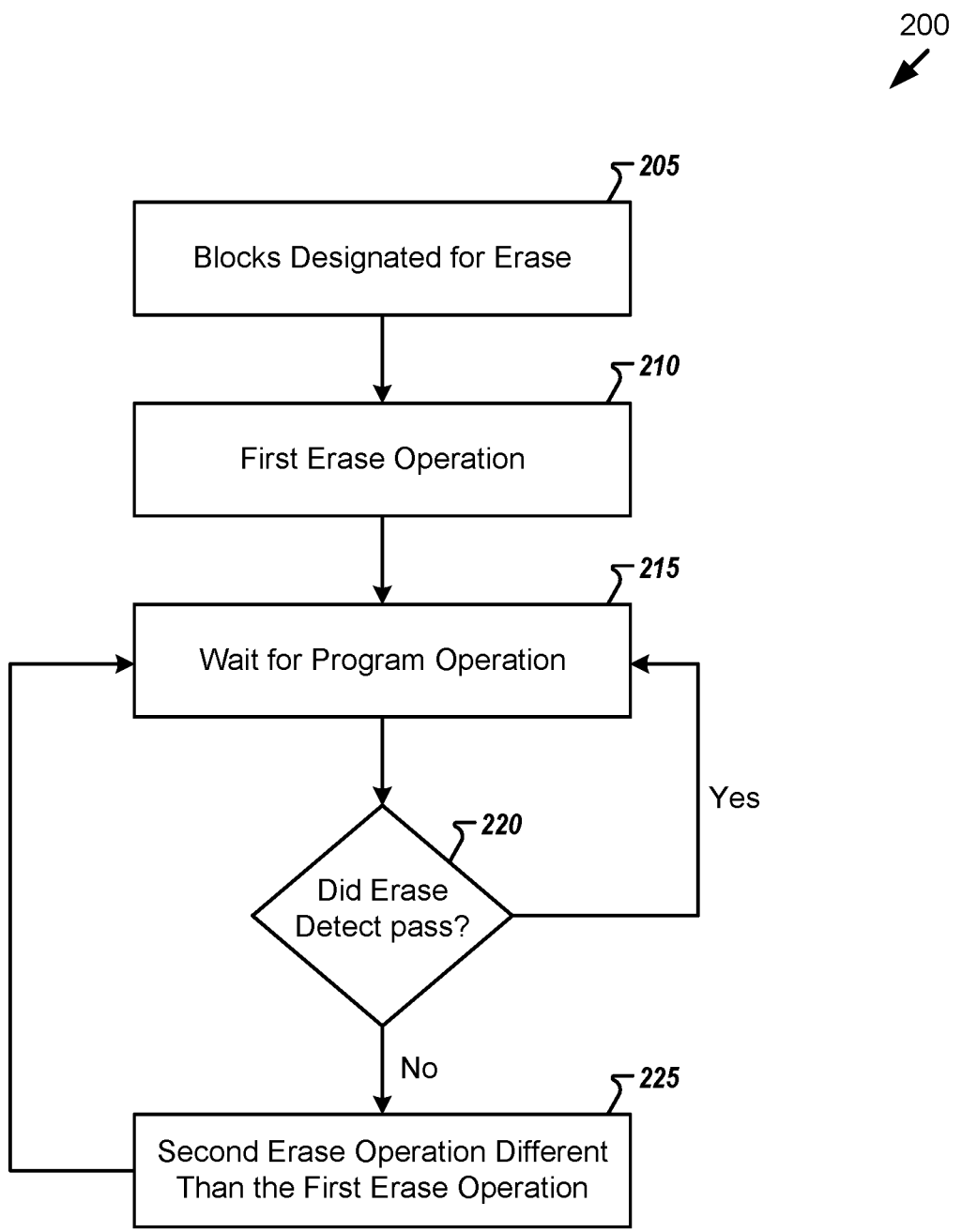
FIG. 2 is a flow diagram of an example method for implementing a low stress refresh erase in a memory device, in accordance with some embodiments of the present disclosure.

FIG. 2 is a flow diagram of an example method 200 for a low stress refresh erase in a memory device, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by local media controller 135 or erase management component 113 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 205, a block is designated for an erase. For example, erase management component 113 can designate the block for an erase operation. In at least one embodiment, the erase management component 113 can receive a program command that indicates the block to erase—e.g., designate to erase. In some embodiments, the erase management component 113 can receive a program command and determine which block to erase or designate for the erase operation. In at least one embodiment, the erase management component 113 can receive an erase command and designate the block indicated in the erase command for the erase operation. In at least one embodiment, the erase management component 113 can wait a duration to program the block after designating the block—e.g., after receiving either the program or erase command. In at least one embodiment, the erase management component 113 can receive the program command or erase command from the host system 120 as described with reference to FIG. 1A.

At operation 210, a first erase operation is performed. For example, the erase management component 113 can cause the first erase operation to be performed at the block designated for erase. In at least one embodiment, the first erase operation can include at least a pre-program voltage, a first erase voltage, and an erase verify voltage. In some embodiments, the erase management component 113 can cause the pre-program voltage to be applied to reset memory cells of the memory array to at least a predetermined voltage level—e.g., reset the memory cells to the predetermine voltage level or higher. In some embodiments, memory cells with a lower voltage threshold can be reset to the predetermined voltage level while memory cells with a higher voltage threshold can remain at their respective voltage levels—e.g., the predetermine voltage level can be between a lowest voltage threshold corresponding to a first logic state and a highest threshold voltage level corresponding to a second logic state. In some embodiments, the erase management component 113 can cause the first erase voltage to be applied to reset a respective threshold voltage level of a memory at or below an erase threshold voltage. In some embodiments, the erase management component 113 can cause the erase verify voltage to be applied to verify if the first erase operation was successful—e.g., verify that the respective memory cell voltage is at or below the erase threshold voltage. In some embodiments, the erase management component 113 can cause the erase verify voltage to be applied to all of the wordlines. In other embodiments, the erase management component 113 can cause the erase verify voltage to be applied in an alternating fashion—e.g., to a first wordline, then a third wordline, then a fifth wordline and so on before applying the erase verify voltage to a second wordline, then a fourth wordline, then a sixth wordline and so on (e.g., to odd numbered wordlines and then even numbered wordlines). In at least one embodiment, the erase management component 113 can determine not all memory cells were erased after applying the first erase voltage and the first erase verify voltage—e.g., determine one or more memory cells fail to satisfy (e.g., are greater than) the erase threshold. In such embodiments, the erase management component 113 can cause an additional erase voltage to be applied as well as cause the erase verify voltage to be applied again. In some embodiments, a magnitude of the additional erase voltage is greater than a magnitude of the first erase voltage—e.g., the erase management component 113 can cause an increase in the magnitude of the erase voltage applied. In at least one embodiment, the erase management component 113 can continue to cause one or more additional erase voltages to be applied and cause the erase verify voltage to be applied after each of the one or more additional erase voltages until the erase verify operation is satisfied, where the magnitude of the respective erase voltage is increased each time—e.g., the erase management component 113 can cause greater erase voltages to be applied until the erase verify is satisfied.

At operation 215, a wait for a program operation is initiated. For example, the erase management component 113 can wait to initiate a program operation. In some embodiments, the erase management component 113 can wait to initiate the program operation until a program command is received. In other embodiments, the erase management component 113 can wait to initiate a program operation after a predetermined duration has elapsed since the erase operation (e.g., after an hour). In at least one embodiment, the erase management component 113 can periodically perform operation 220 while waiting to initiate the program operation—e.g. the erase management component 113 can perform operation 220 each time a predetermined period elapses or according to a predetermined algorithm.

At operation 220, whether the block passed an erase detection operation is determined. For example, the erase management component 113 can initiate an erase detection operation and determine if the block satisfies the erase detection operation—e.g., the erase management component 113 can initiate the erase detection operation after a predetermined duration elapses after the first erase operation. In at least one embodiment, the erase management component 113 can cause a read voltage to be applied to one or more wordlines of the block. In at least one embodiment, the erase management component 113 can cause the read voltage to be applied to random wordlines. In at least one embodiment, the erase management component 113 can cause the read voltage to be applied according to a pre-determined algorithm or pattern. In some embodiments, the erase management component 113 can cause the read voltage to be applied to determine whether a respective memory cell threshold voltage satisfies the read voltage—e.g., whether the respective memory cell threshold voltage is less than the read voltage. In at least one embodiment, a magnitude of the read voltage is equal to a magnitude of the erase threshold voltage. Accordingly, the erase management component 113 can determine whether a voltage shift at a memory cell caused the respective threshold voltage of the memory cell to exceed the erase threshold. In some embodiments, the erase management component 113 can determine a number of wordlines (e.g., or memory cells) that fail to satisfy the erase threshold. In at least one embodiment, the erase management component 113 can compare the number of wordlines that fail to satisfy the erase threshold with a threshold number. If the erase management component 113 determines the number fails to satisfy the threshold number, the erase management component 113 can determine the block fails the erase detection operation and proceed to operation 225. If the erase management component 113 determines the number satisfies the threshold number, the erase management component 113 can determine the block passes the erase detection operation and proceed to block 215—e.g., the erase management component 113 can continue to wait to initiate the program operation and periodically perform the erase detection operation.

At operation 225, a second erase operation is performed. For example, the erase management component 113 can cause the second operation to be performed at the block. In at least one embodiment, the second erase operation is different than the first erase operation. For example, the erase management component 113 can cause at least one fewer voltage to be applied during the second erase operation than the first erase operation. For example, the erase management component 113 can refrain from causing the pre-program pulse to be applied during the second erase operation. In at least one embodiment, the erase management component 113 can cause a relatively small pre-program voltage to be applied during the second erase operation. For example, the first erase operation can include application of a pre-program voltage having a first magnitude and the second erase operation can include application of a pre-program voltage having a second magnitude, where the first magnitude is greater than the second magnitude. In at least one embodiment, the erase management component 113 can cause a second erase voltage and the erase verify voltage to be applied to the block during the second erase operation. In some embodiments, a magnitude of the second erase voltage can be less than a magnitude of the first erase voltage—e.g., the erase management component 113 can cause a smaller erase voltage to be applied during the second erase operation compared to the first erase operation. In at least one embodiment, erase management component 113 can cause the first erase voltage to be applied for a first duration and the second erase voltage to be applied for a second duration, where the first duration is greater than or equal to the second duration. In at least one embodiment, the erase management component 113 can determine the second erase did not erase all memory cells after causing the second erase voltage to be applied. In such embodiments, the erase management component 113 can cause a second set of one or more erase voltages to be applied until the erase verify is satisfied for the second erase operation, where each subsequent erase voltage has a magnitude greater than the previous erase voltage. In at least one embodiment, a magnitude of an erase voltage of the one or more additional erase voltages applied during the first erase operation is smaller than a magnitude of a corresponding erase voltage of the second set of one or more additional erase voltages. For example, the erase management component 113 can cause a third erase voltage to be applied during the first operation after applying the first erase voltage and the corresponding erase verify voltage. The erase management component 113 can also cause a fourth erase voltage to be applied during the second operation after applying the second erase voltage and the corresponding erase verify voltage. In such embodiments, a magnitude of the third erase voltage is greater than a magnitude of the fourth erase voltage.

By utilizing the second erase operation, the erase management component 113 can improve data retention, reduce programming disturbances, and improve the overall performance of the system.

Figure 3:
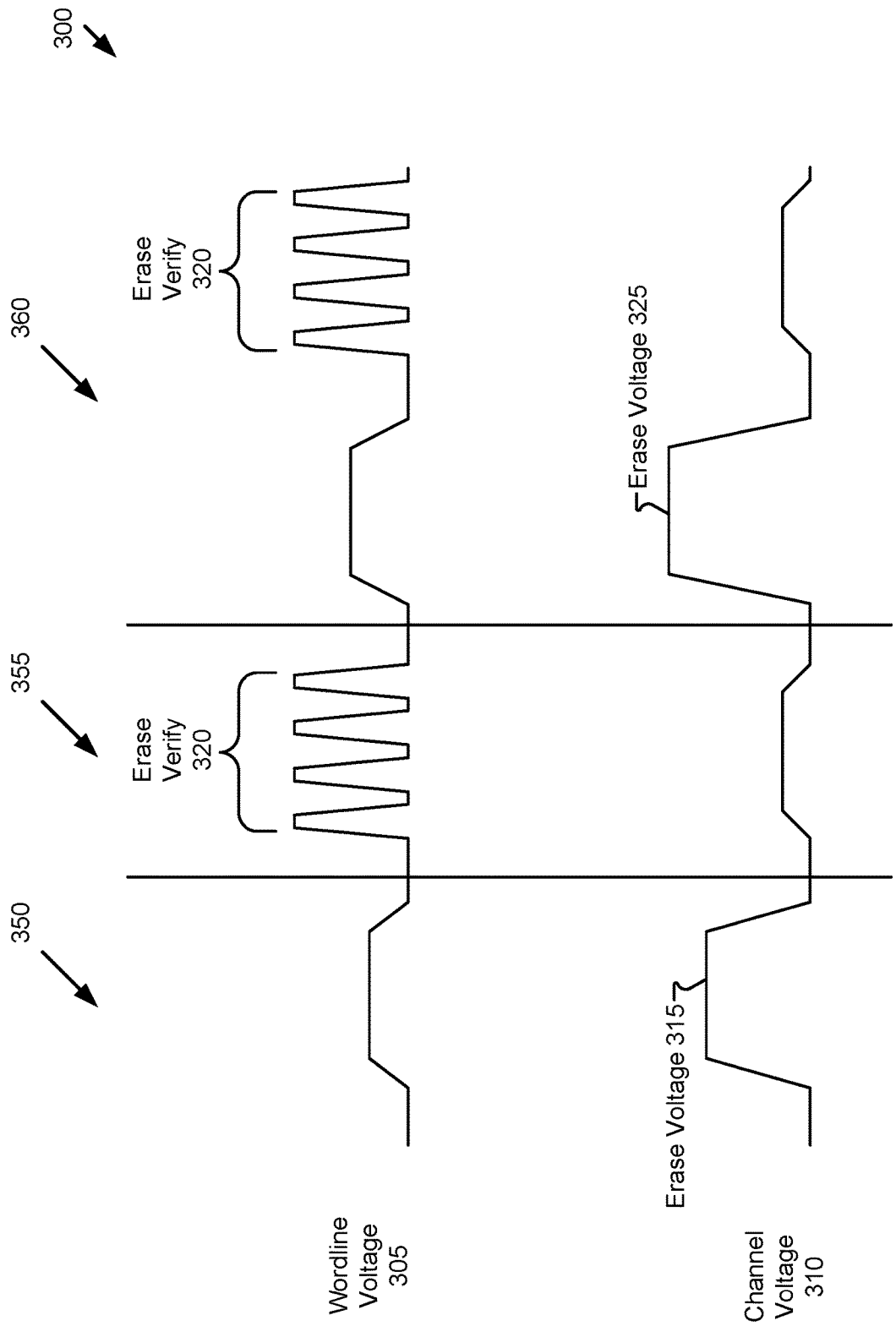
FIG. 3 is a timing diagram for operation of a memory device during a low stress refresh erase, in accordance with embodiments of the present disclosure.

FIG. 3 is a timing diagram 300 a low stress refresh erase in a memory device, in accordance with some embodiments of the present disclosure. In at least one embodiment, the operations of timing diagram 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the operations of timing diagram 300 are performed by local media controller 135 or erase management component 113 of FIG. 1A and FIG. 1B. During an erase operation (e.g., a second erase operation as described with reference to FIG. 2) performed on a non-volatile memory device, such as memory device 130, certain voltages can be applied to wordlines and the channel. FIG. 3 illustrates a voltage across the wordline (e.g., the wordline voltage 305) and a voltage across the channel (e.g., channel voltage 310) during the erase operation. In this embodiment, the erase operation includes three (3) time intervals (e.g. time interval 350, time interval 355, and time interval 360). It should be noted, each time interval is an example and is not limiting on the claims. That is, each time interval can be longer or faster than illustrated in FIG. 3 in some embodiments. Other time intervals are possible. In at least one embodiment, time interval 350 is associated with an erase, time interval 355 is associated with an erase verify, and time interval 360 is associated with an optional repeat of the erase and erase verify if the erase of time interval 350 was not successful.

During time interval 350, the erase management component 113 can cause an erase voltage 315 to be applied across the channel. In at least one embodiment, the erase voltage 315 is configured to erase memory cells of a block. In some embodiments, a magnitude of erase voltage 315 is less than a magnitude of a corresponding first erase voltage in a first erase operation as described with reference to FIG. 2. In at least one embodiment, the erase management component 113 is configured to cause the erase voltage 315 to be applied for a first duration, less than a second duration associated with applying the first erase voltage in the first erase operation as described with reference to FIG. 2. In at least one embodiment, the erase operation illustrated in timing diagram 300 does not include a pre-programming voltage. In at least one embodiment, the erase management component 113 can cause a pre-program voltage with a relatively small voltage to be applied before causing application of the erase voltage 315. In such embodiments, the pre-program voltage can be smaller than a corresponding pre-program voltage of the first erase operation as described with reference to FIG. 2. That is, the erase management component 113 can either refrain from causing the pre-programming voltage to be applied or cause a relatively small pre-program voltage to be applied during the second erase operation.

During time interval 355, the erase management component 113 can cause an erase verify voltage 320 to be applied to a wordline. In at least one embodiment, the erase management component 113 can cause the erase verify voltage 320 to be applied to all wordlines of a block. In some embodiments, the erase management component 113 can cause the erase verify voltage 320 to be applied to alternative wordlines—e.g., to a first wordline, then a third wordline, then a fifth wordline and so on before applying the erase verify voltage to a second wordline, then a fourth wordline, then a sixth wordline and so on (e.g., to odd numbered wordlines and then even numbered wordlines). In at least one embodiment, the erase management component 113 can cause the erase verify voltage 320 to be applied to verify the erase operation of time interval 305 as described with reference to FIG. 3. If the erase management component 113 determines the block satisfies the erase verify operation, the erase management component 113 can end the erase operation—e.g., the erase management component 113 can refrain from performing the operations of time interval 360. If the erase management component 113 determines the block fails to satisfy the erase verify operation, the erase management component 113 can proceed to the operations of time interval 360.

During time interval 360, the erase management component 113 can cause an erase voltage 325 to be applied across the channel. In at least one embodiment, a magnitude of the erase voltage 325 is greater than the magnitude of the erase voltage 315—e.g., the erase management component 113 can increase the erase voltage magnitude if the erase of time interval 350 did not satisfy the erase verify. In at least one embodiment, the erase management component 113 can cause a second erase verify voltage 320 to be applied to the wordline after causing the erase voltage 325 to be applied. In at least one embodiment, the erase management component 113 can determine the erase of time interval 360 satisfied the erase verify. In such embodiments, the erase management component 113 can end the erase operation—e.g., the erase management component 113 can refrain from performing additional operations. In at least one embodiment, the erase management component 113 can determine the erase of time interval 360 did not satisfy the erase verify. In such embodiments, the erase management component 113 can repeat the operations of time interval 360 until the erase operation is complete. For example, the erase management component 113 can cause an erase voltage that has a magnitude greater than a magnitude of an erase voltage applied in a previous time interval—e.g., the erase management component 113 can cause a third erase voltage having a third magnitude to be applied during a subsequent time interval, where the third magnitude is greater than the magnitude of the erase voltage 320. In at least one embodiment, the erase management component 113 can cause the erase verify voltage 320 to be applied after causing a respective erase voltage to be applied across the channel.

Figure 4:
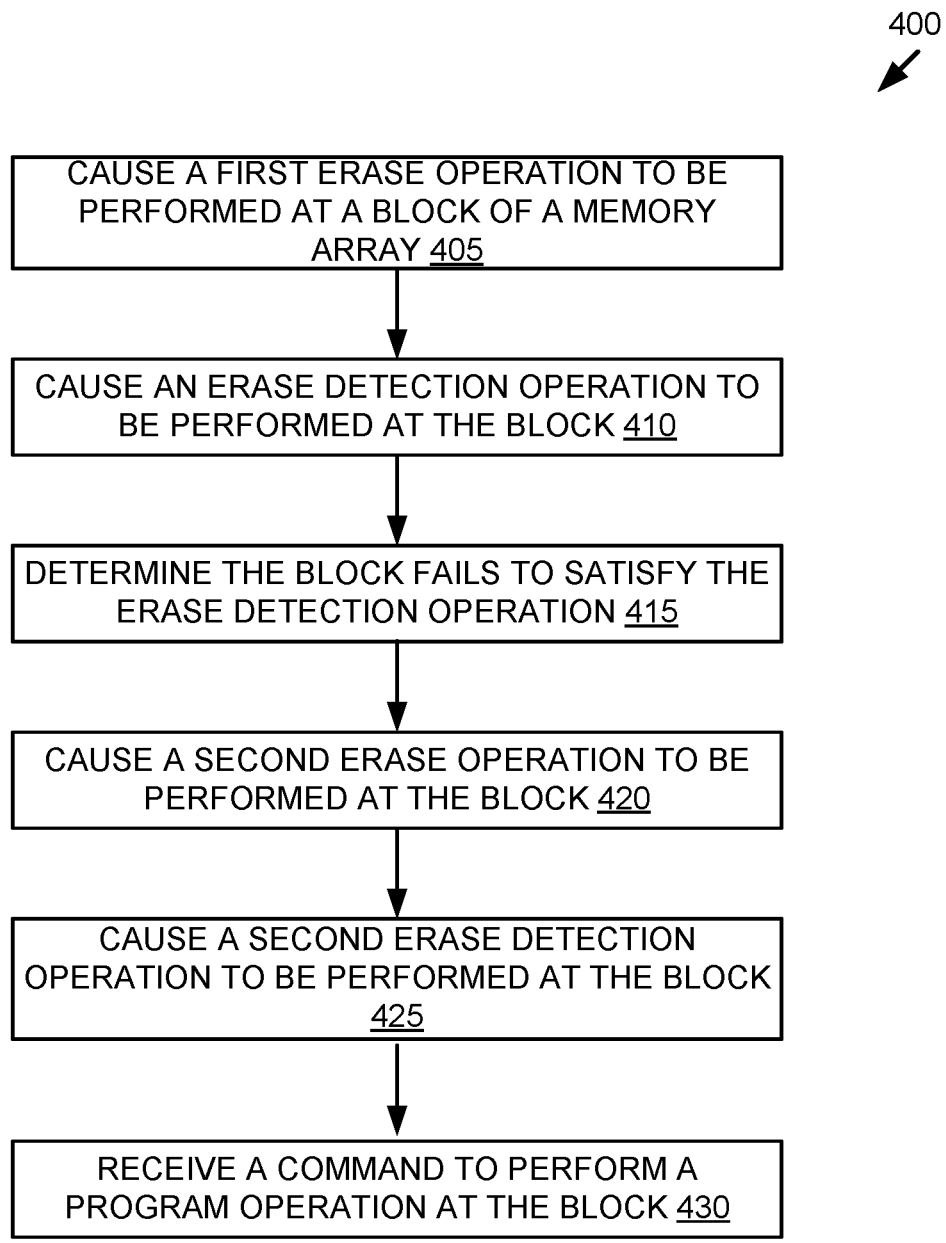
FIG. 4 is a flow diagram of an example method of implementing a low stress refresh erase, in accordance with some embodiments of the present disclosure.

FIG. 4 is a flow diagram of an example method for a low stress refresh erase in a memory device, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by local media controller 135 or erase management component 113 of FIG. 1A and FIG. 1B. For example, in at least one embodiment, the method 400 is performed by the memory sub-system controller 115 on the memory device 130—e.g., the erase management component 113 can initiate operations on memory cells of memory array 104 of memory device 130 as described with reference to FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, a first erase operation is performed at a block of a memory device. For example, the processing logic (e.g., erase management component 113) causes the first operation to be performed at the block of the memory device. In one embodiment, the processing logic causes, during the first erase operation, a pre-program voltage and a first erase voltage having a first magnitude to be applied to the block. In at least one embodiment, the first erase operation causes three or more voltages to be applied to the block. For example, the processing logic can cause at least a pre-program voltage, a first erase voltage having a first magnitude, and an erase verify voltage to be applied to the block—e.g., the three or more voltages of the first erase operation include the pre-program voltage, the first erase voltage having a first magnitude, and the erase verify voltage. In at least one embodiment, the processing logic is to determine the block is not erased (e.g., not erased entirely) responsive to applying the erase verify voltage. In such embodiments, the processing logic applies an additional erase voltage and an additional erase verify voltage to the block. In at least one embodiment, the processing logic continues to apply additional erase voltages and erase verify voltages until the block is erased during the first erase operation. In at least one embodiment, the additional erase voltage has a magnitude greater than a magnitude of the first erase voltage. In at least one embodiment, the first erase voltage is applied for a first duration. In some embodiments, the processing logic receives a command to erase the block of the memory device, where the processing logic is to cause the first erase operation responsive to receiving the command. In at least one embodiment, the memory device includes quad-level cells (e.g., QLC memory cells).

At operation 410, an erase detection operation is performed at the block. For example, the processing logic causes the erase detection operation to be performed at the block of the memory device. In at least one embodiment, the erase detection operation is performed after the first erase operation. In at least one embodiment, the erase detection operation is performed after a first duration elapses following the first erase operation. In some embodiments, the processing logic is to cause a read voltage to be applied during the erase operation. That is, the processing logic can perform the erase detection operation to determine whether the first erase operation is valid after the first duration elapses. For example, the processing logic can periodically perform the erase detection operation after the first erase operation to ensure the first erase operation is still valid until the processing logic receives a program command for the block—e.g., the processing logic can perform the erase detection operation periodically to ensure the first duration elapsing has not caused a voltage threshold shift to occur at one or more memory cells until the programming operation at the block is initiated. In at least one embodiment, the processing logic causes a read voltage to be applied during the erase detection operation.

At operation 415, the block fails to satisfy the erase detection operation. For example, the processing logic determines the block fails to satisfy the erase detection operation responsive to causing the erase detection operation to be performed. In at least one embodiment, the processing logic determines one or more wordlines of the block exceed the read voltage, where the processing logic is to determine the block failed the erase detection responsive to determining the one more wordlines of the block exceed the read voltage.

In at least one embodiment, the processing logic determines a number of wordlines of the block that fail to satisfy the read voltage. In such embodiments, the processing logic compares the number of wordlines to a threshold number and determines the block fails to satisfy the erase detection operation if the number of wordlines is equal to or greater than the threshold number. For example, due to voltage threshold shifts (e.g., due to holes de-trapping as described with reference to FIG. 2), certain memory cells or wordlines can shift beyond a threshold erase voltage level—e.g., the read voltage. When the processing logic determines the number of memory cells or wordlines shifting beyond the threshold erase voltage level is greater than the threshold number, the processing logic can proceed to operation 420. In at least one embodiment, if the processing logic determines the block satisfies the erase detection operation, the processing logic can return back to operation 410—e.g., wait until the first duration elapses and perform an additional erase detection operation and so forth until the programming operation at the block is initiated.

At operation 420, a second erase operation is performed. For example, the processing logic causes a second erase to be performed at the block of the memory device responsive to determining that the block failed the erase detection operation. In at least one embodiment, the second erase operation causes operation causes a second erase voltage having a second magnitude to be applied to the block—e.g., the processing logic can refrain from applying the pre-program voltage in the second erase operation. In at least one embodiment, the second erase operation causes two voltages to be applied to the block—e.g., the second erase voltage having the second magnitude and the erase verify voltage. In such embodiments, the second operation causes at least one fewer voltage to be applied to the block than the first erase operation. In at least one embodiment, the first magnitude of the first erase voltage is greater than the second magnitude of the second erase voltage—e.g., the processing logic can apply a smaller erase voltage during the second erase operation. In at least one embodiment, the second erase voltage is applied for a second duration. In such embodiments, the first duration of the first erase voltage applied is greater than the second duration. In at least one embodiment, the erase verify voltage is applied to each wordline of the block. In some embodiments, the erase verify voltage is applied to alternate wordlines—e.g., to each even wordline and then to each wordline. In at least one embodiment, the processing logic causes a second pre-program voltage to be applied to the block during the second erase operation. In some embodiments, the pre-program voltage of the first erase operation can have a third magnitude and the second pre-program voltage can have a fourth magnitude, the third magnitude greater than the fourth magnitude.

At operation 425, a second erase detection operation is performed at the block. For example, the processing logic causes a second erase detection operation to be performed at the block responsive to causing the second erase detection operation to be performed. In at least one embodiment, the second erase detection operation is performed after the first duration elapses following the second erase operation. In at least one embodiment, the processing logic can determine the block satisfies the second erase detection operation responsive to causing the second erase detection operation to be performed. For example, the processing logic can determine a number of wordlines satisfying the read voltage and compare the number of wordlines to a threshold number. The processing logic can determine the block satisfies the erase detection operation if the number of wordlines is less than the threshold number. In at least one embodiment, the processing logic can refrain from performing the second erase operation responsive to determining that the block satisfies the second erase operation—e.g., the processing logic can wait and return to operation 415 to perform the erase detection operation after the first duration elapses until a programming command is received.

At operation 430, a command to perform a program operation at the block is received. For example, the processing logic receives the command to perform a program operation at the block of the memory device after performing the second erase operation. In one embodiment, processing logic causes a programming operation to be performed at the block of the memory device responsive to receiving the command. In at least one embodiment, the processing logic can perform the erase detection operation periodically (e.g., after the first duration elapses, after a certain time period elapses between erase detection operations, randomly after a previous erase detection operation, etc.) between causing the second erase operation to be performed and causing the programming operation to be performed at the block of the memory device.

Figure 5:
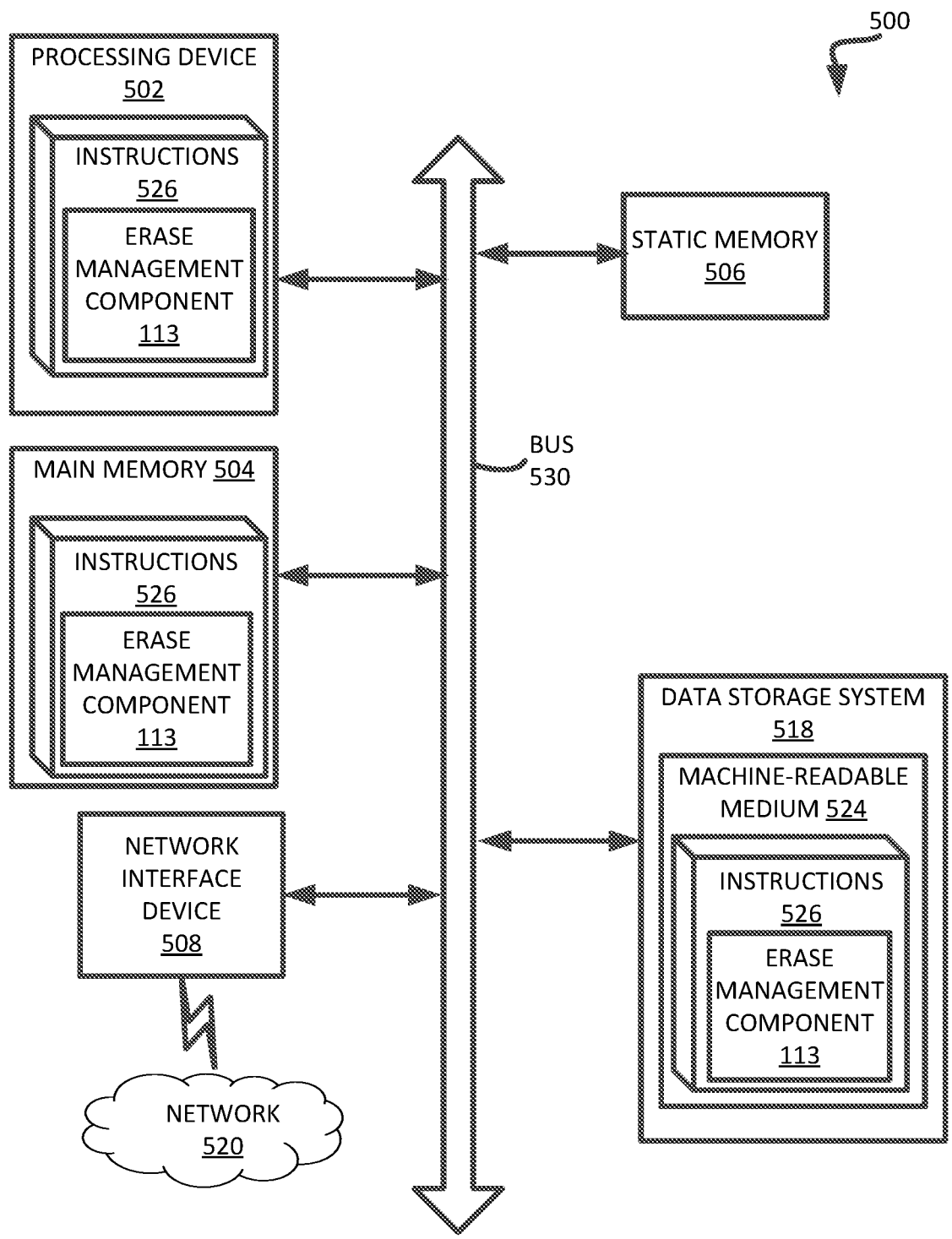
FIG. 5 is a block diagram of an example computer system in which embodiments of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the erase management component 113 of FIG. 1 to perform an erase operation). In at least one embodiment, the erase management component 113 is configured to perform a first erase operation on a block that includes at least a pre-program voltage, a first erase voltage, and an erase verify voltage. In some embodiments, the erase management component 113 can periodically perform an erase detection operation while waiting for a program command after performing the first erase operation. In at least one embodiment, the erase management component 113 can perform a second erase operation if the block fails to satisfy the erase detection operation. In such embodiments, the second erase operation includes a second erase voltage and the erase verify voltage—e.g., the erase management component 113 can refrain from applying the pre-program voltage in the second erase operation. In at least one embodiment, the second erase voltage has a magnitude less than a magnitude of the first erase voltage. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or RDRAM, etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 404 can correspond to the memory sub-system 110 of FIG. 1.

In one embodiment, the instructions 526 include instructions to implement functionality corresponding to a erase management component 113 to perform a program operation for the processing device 502. While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A system comprising:
a memory device; and a processing device, operatively coupled with the memory device, to perform operations comprising:
  causing a first erase operation to be performed at a block of the memory device, wherein the first erase operation causes a pre-program voltage and a first erase voltage having a first magnitude to be applied to the block;
  causing an erase detection operation to be performed at the block of the memory device;
  determining that the block fails to satisfy the erase detection operation responsive to causing the erase detection operation to be performed; and
  causing a second erase operation to be performed at the block of the memory device responsive to determining that the block failed the erase detection operation, wherein the second erase operation causes a second erase voltage having a second magnitude to be applied to the block.

2. The system of claim 1, wherein the first magnitude of the first erase voltage is greater than the second magnitude of the second erase voltage.

3. The system of claim 1, wherein the first erase voltage is applied for a first duration and the second erase voltage is applied for a second duration, and wherein the first duration is greater than the second duration.

4. The system of claim 1, wherein the processing device is to perform further operations comprising:
  causing a read voltage to be applied during the erase detection operation; and
  determining one or more wordlines of the block exceed the read voltage, wherein the processing device is to determine that the block failed the erase detection operation responsive to determining the one or more wordlines of the block exceed the read voltage.

5. The system of claim 1, wherein the processing device is to perform further operations comprising:
  causing a second erase detection operation to be performed at the block responsive to causing the second erase operation to be performed;
  determining that the block satisfies the second erase detection operation responsive to causing the second erase detection operation to be performed; and
  refraining from performing the second erase operation responsive to determining that the block satisfies the second erase detection operation.

6. The system of claim 1, wherein the processing device is to perform further operations comprising:
  receiving a command to perform a program operation at the block of the memory device after performing the second erase operation; and
  causing a programming operation to be performed at the block of the memory device responsive to receiving the command.

7. The system of claim 6, wherein the processing device is to perform the erase detection operation periodically between causing the second erase operation to be performed and causing the programming operation to be performed at the block of the memory device.

8. The system of claim 1, wherein the processing device is to perform further operations comprising:
  receiving a command to erase the block of the memory device, wherein the processing device is to cause the first erase operation to be performed responsive to receiving the command.

9. A method comprising:
  causing a first erase operation to be performed at a block of a memory device, wherein the first erase operation causes a pre-program voltage and a first erase voltage having a first magnitude to be applied to the block;
  causing an erase detection operation to be performed at the block of the memory device;
  determining that the block fails to satisfy the erase detection operation responsive to causing the erase detection operation to be performed; and
  causing a second erase operation to be performed at the block of the memory device responsive to determining that the block failed the erase detection operation, wherein the second erase operation causes a second erase voltage having a second magnitude to be applied to the block.

10. The method of claim 9, wherein the first magnitude of the first erase voltage is greater than the second magnitude of the second erase voltage.

11. The method of claim 9, wherein the first erase voltage is applied for a first duration and the second erase voltage is applied for a second duration, and wherein the first duration is greater than the second duration.

12. The method of claim 9, further comprising:
  causing a read voltage to be applied during the erase detection operation; and
  determining one or more wordlines of the block fail to satisfy the read voltage, determining that the block failed the erase detection operation is responsive to determining the one or more wordlines of the block fail to satisfy the read voltage.

13. The method of claim 9, further comprising:
  causing a second erase detection operation to be performed at the block responsive to causing the second erase operation to be performed;
  determining that the block satisfies the second erase detection operation responsive to causing the second erase detection operation to be performed; and
  refraining from performing the second erase operation responsive to determining that the block satisfies the second erase detection operation.

14. The method of claim 9, further comprising:
  receiving a command to perform a program operation at the block of the memory device after performing the second erase operation; and
  causing a programming operation to be performed at the block of the memory device responsive to receiving the command.

15. The method of claim 14, wherein the erase detection operation is performed periodically between causing the second erase operation to be performed and causing the programming operation to be performed at the block of the memory device.

16. The method of claim 9, further comprising:
  receiving a command to erase the block of the memory device; and
  causing the first erase operation to be performed responsive to receiving the command.

17. A memory device comprising:
  a memory device; and
  processing device, operatively coupled with the memory device, to perform operations comprising:
    causing an erase detection operation to be performed at a block of the memory device after a first erase operation, wherein the first erase operation causes three or more voltages to be applied to the block;
    determining that the block fails to satisfy the erase detection operation responsive to causing the erase detection operation; and causing a second erase operation to be performed at the block of the memory device responsive to determining that the block failed the erase detection operation, wherein the second erase operation causes two voltages to be applied to the block.

18. The memory device of claim 17, wherein:
wherein the three or more voltages of the first erase operation comprise at least a pre-program voltage, a first erase voltage having a first magnitude, and an erase verify voltage; and
wherein the two voltage of the second erase operation comprise a second erase voltage having a second magnitude and the erase verify voltage, wherein the first magnitude is greater than the second magnitude.

19. The memory device of claim 18, wherein the first erase voltage is applied for a first duration and the second erase voltage is applied for a second duration, wherein the first duration is greater than the second duration.

20. The memory device of claim 17, wherein the processing device is to perform further operations comprising:
causing a second erase detection operation to be performed at the block responsive to causing the second erase operation to be performed;
determining that the block satisfies the second erase detection operation responsive to causing the second erase detection operation to be performed; and
refraining from performing the second erase operation responsive to determining that the block satisfies the second erase detection operation.

* * * * *